(12) United States Patent
Widjaja

(10) Patent No.: US 11,404,420 B2
(45) Date of Patent: *Aug. 2, 2022

(54) METHOD OF OPERATING SEMICONDUCTOR MEMORY DEVICE WITH FLOATING BODY TRANSISTOR USING SILICON CONTROLLED RECTIFIER PRINCIPLE

(71) Applicant: Zeno Semiconductor, Inc., Sunnyvale, CA (US)

(72) Inventor: Yuniarto Widjaja, Cupertino, CA (US)

(73) Assignee: Zeno Semiconductor, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/232,587

(22) Filed: Apr. 16, 2021

(65) Prior Publication Data
US 2021/0257365 A1 Aug. 19, 2021

Related U.S. Application Data

(63) Continuation of application No. 16/846,692, filed on Apr. 13, 2020, now Pat. No. 10,991,698, which is a
(Continued)

(51) Int. Cl.
*H01L 27/108* (2006.01)
*G11C 11/404* (2006.01)
(Continued)

(52) U.S. Cl.
CPC ...... *H01L 27/10802* (2013.01); *G11C 11/404* (2013.01); *G11C 11/406* (2013.01);
(Continued)

(58) Field of Classification Search
CPC ........... H01L 27/10802; H01L 29/7841; G11C 11/404; G11C 11/406; G11C 11/4076; G11C 11/4096; G11C 2211/4016
See application file for complete search history.

(56) References Cited

U.S. PATENT DOCUMENTS 4,300,212 A 11/1981 Simko
4,959,812 A 9/1990 Momodomi et al.
(Continued)

OTHER PUBLICATIONS

Chatterjee, et al. "Taper isolated dynamic gain RAM cell." Electron Devices Meeting, 1978 International. vol. 24. IEEE, 1978, pp. 698-699.
(Continued)

*Primary Examiner* — Tri M Hoang
(74) *Attorney, Agent, or Firm* — Law Office of Alan W. Cannon

(57) ABSTRACT

Methods of operating semiconductor memory devices with floating body transistors, using a silicon controlled rectifier principle are provided, as are semiconductor memory devices for performing such operations. A method of maintaining the data state of a semiconductor dynamic random access memory cell is provided, wherein the memory cell comprises a substrate being made of a material having a first conductivity type selected from p-type conductivity type and n-type conductivity type; a first region having a second conductivity type selected from the p-type and n-type conductivity types, the second conductivity type being different from the first conductivity type; a second region having the second conductivity type, the second region being spaced apart from the first region; a buried layer in the substrate below the first and second regions, spaced apart from the first and second regions and having the second conductivity type; a body region formed between the first and second regions and the buried layer, the body region having the first conductivity type; and a gate positioned between the first and second regions and adjacent the body region. The memory cell is configured to store a first data state which corresponds to a first charge in the body region in a first configuration, and a second data state which corresponds to a second charge in the body region in a second configuration.

(Continued)

The method includes: providing the memory cell storing one of the first and second data states; and applying a positive voltage to a substrate terminal connected to the substrate beneath the buried layer, wherein when the body region is in the first state, the body region turns on a silicon controlled rectifier device of the cell and current flows through the device to maintain configuration of the memory cell in the first memory state, and wherein when the memory cell is in the second state, the body region does not turn on the silicon controlled rectifier device, current does not flow, and a blocking operation results, causing the body to maintain the second memory state.

22 Claims, 8 Drawing Sheets

Related U.S. Application Data continuation of application No. 16/242,430, filed on Jan. 8, 2019, now Pat. No. 10,644,002, which is a continuation of application No. 15/933,897, filed on Mar. 23, 2018, now Pat. No. 10,211,209, which is a continuation of application No. 15/675,523, filed on Aug. 11, 2017, now Pat. No. 9,960,166, which is a continuation of application No. 15/290,996, filed on Oct. 11, 2016, now Pat. No. 9,761,589, which is a continuation of application No. 14/956,103, filed on Dec. 1, 2015, now Pat. No. 9,484,082, which is a continuation of application No. 14/444,109, filed on Jul. 28, 2014, now Pat. No. 9,230,965, which is a continuation of application No. 14/023,246, filed on Sep. 10, 2013, now Pat. No. 8,837,247, which is a continuation of application No. 13/244,916, filed on Sep. 26, 2011, now Pat. No. 8,559,257, which is a continuation of application No. 12/533,661, filed on Jul. 31, 2009, now Pat. No. 8,077,536.

(60) Provisional application No. 61/086,170, filed on Aug. 5, 2008.

(51) Int. Cl.
*G11C 11/4076* (2006.01)
*H01L 29/78* (2006.01)
*G11C 11/406* (2006.01)
*G11C 11/4096* (2006.01)

(52) U.S. Cl.
CPC ...... *G11C 11/4076* (2013.01); *G11C 11/4096* (2013.01); *H01L 29/7841* (2013.01); *G11C 2211/4016* (2013.01)

(56) References Cited

U.S. PATENT DOCUMENTS

| | | |
|---|---|---|
| 5,519,831 A | 5/1996 | Holzhammer |
| 5,581,504 A | 12/1996 | Chang et al. |
| 5,767,549 A | 6/1998 | Chen et al. |
| 5,999,444 A | 12/1999 | Fujiwara et al. |
| 6,005,818 A | 12/1999 | Ferrant et al. |
| 6,141,248 A | 10/2000 | Forbes et al. |
| 6,163,048 A | 12/2000 | Hirose et al. |
| 6,166,407 A | 12/2000 | Ohta |
| 6,341,087 B1 | 1/2002 | Kunikiyo et al. |
| 6,356,485 B1 | 3/2002 | Proebsting |
| 6,376,876 B1 | 4/2002 | Shin et al. |
| 6,542,411 B2 | 4/2003 | Tanikawa et al. |
| 6,614,684 B1 | 9/2003 | Shukuri et al. |
| 6,686,624 B2 | 2/2004 | Hsu |
| 6,724,657 B2 | 4/2004 | Shukuri et al. |
| 6,791,882 B2 | 9/2004 | Seki et al. |
| 6,801,452 B2 | 10/2004 | Miwa et al. |
| 6,885,581 B2 | 4/2005 | Nemati et al. |
| 6,913,964 B2 | 7/2005 | Hsu |
| 6,925,006 B2 | 8/2005 | Fazan et al. |
| 6,954,377 B2 | 10/2005 | Choi et al. |
| 6,969,662 B2 | 11/2005 | Fazan et al. |
| 7,085,156 B2 | 8/2006 | Ferrant et al. |
| 7,118,986 B2 | 10/2006 | Steigerwalt et al. |
| 7,170,807 B2 | 1/2007 | Fazan et al. |
| 7,224,019 B2 | 5/2007 | Hieda et al. |
| 7,259,420 B2 | 8/2007 | Anderson et al. |
| 7,259,992 B2 | 8/2007 | Shirota |
| 7,285,820 B2 | 10/2007 | Park et al. |
| 7,301,803 B2 | 11/2007 | Okhonin et al. |
| 7,329,580 B2 | 2/2008 | Cho et al. |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,504,302 B2 | 3/2009 | Matthew et al. |
| 7,541,636 B2 | 6/2009 | Ranica et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,701,763 B2 | 4/2010 | Roohparvar |
| 7,733,693 B2 | 6/2010 | Ferrant et al. |
| 7,759,715 B2 | 7/2010 | Bhattacharyya |
| 7,760,548 B2 | 7/2010 | Widjaja |
| 7,847,338 B2 | 12/2010 | Widjaja |
| 8,014,200 B2 | 9/2011 | Widjaja |
| 8,036,033 B2 | 10/2011 | Widjaja |
| 8,059,459 B2 | 11/2011 | Widjaja |
| 8,077,536 B2 | 12/2011 | Widjaja |
| 8,120,951 B2 * | 2/2012 | Mouli ............... H01L 45/16 365/175 |
| 8,130,547 B2 | 3/2012 | Widjaja et al. |
| 8,130,548 B2 | 3/2012 | Widjaja et al. |
| 8,159,878 B2 | 4/2012 | Widjaja |
| 8,174,886 B2 | 5/2012 | Widjaja et al. |
| 8,194,451 B2 | 6/2012 | Widjaja |
| 8,208,302 B2 | 6/2012 | Widjaja |
| 8,294,193 B2 | 10/2012 | Widjaja |
| 8,391,066 B2 | 3/2013 | Widjaja |
| 8,472,249 B2 | 6/2013 | Widjaja |
| 8,514,622 B2 | 8/2013 | Widjaja |
| 8,514,623 B2 | 8/2013 | Widjaja et al. |
| 8,531,881 B2 | 9/2013 | Widjaja |
| 8,559,257 B2 | 10/2013 | Widjaja |
| 8,570,803 B2 | 10/2013 | Widjaja |
| 8,654,583 B2 | 2/2014 | Widjaja |
| 8,711,622 B2 | 4/2014 | Widjaja |
| 8,787,085 B2 | 7/2014 | Widjaja |
| 8,837,247 B2 | 9/2014 | Widjaja |
| 8,923,052 B2 | 12/2014 | Widjaja |
| 9,153,333 B2 | 10/2015 | Widjaja |
| 9,230,965 B2 | 1/2016 | Widjaja |
| 9,257,179 B2 | 2/2016 | Widjaja |
| 9,460,790 B2 | 10/2016 | Widjaja |
| 9,484,082 B2 | 11/2016 | Widjaja |
| 9,646,693 B2 | 5/2017 | Widjaja |
| 9,761,311 B2 | 9/2017 | Widjaja |
| 9,761,589 B2 | 9/2017 | Widjaja |
| 9,928,910 B2 | 3/2018 | Widjaja |
| 9,960,166 B2 | 5/2018 | Widjaja |
| 10,211,209 B2 | 2/2019 | Widjaja |
| RE47,381 E | 5/2019 | Widjaja |
| 10,468,102 B2 | 11/2019 | Widjaja |
| 10,644,002 B2 | 5/2020 | Widjaja |
| 10,818,354 B2 | 10/2020 | Widjaja |
| 10,825,520 B2 | 11/2020 | Widjaja |
| 10,991,698 B2 * | 4/2021 | Widjaja ............... G11C 11/404 |
| 2002/0018366 A1 | 2/2002 | Schwerin et al. |
| 2002/0048193 A1 | 4/2002 | Tanikawa et al. |

(56) References Cited

U.S. PATENT DOCUMENTS

| | | |
|---|---|---|
| 2005/0024968 A1 | 2/2005 | Lee et al. |
| 2005/0032313 A1 | 2/2005 | Forbes |
| 2005/0124120 A1 | 6/2005 | Du et al. |
| 2005/0133789 A1 | 6/2005 | Oh et al. |
| 2006/0044915 A1 | 3/2006 | Park et al. |
| 2006/0125010 A1 | 6/2006 | Bhattacharyya |
| 2006/0157679 A1 | 7/2006 | Scheuerlein |
| 2006/0227601 A1 | 10/2006 | Bhattacharyya |
| 2006/0237770 A1 | 10/2006 | Huang et al. |
| 2006/0278915 A1 | 12/2006 | Lee et al. |
| 2007/0004149 A1 | 1/2007 | Tews |
| 2007/0090443 A1 | 4/2007 | Choi et al. |
| 2007/0164351 A1 | 7/2007 | Hamamoto |
| 2007/0164352 A1 | 7/2007 | Padilla |
| 2007/0210338 A1 | 9/2007 | Orlowski |
| 2007/0215954 A1 | 9/2007 | Mouli |
| 2007/0284648 A1 | 12/2007 | Park et al. |
| 2008/0048239 A1 | 2/2008 | Huo et al. |
| 2008/0080248 A1 | 4/2008 | Lue et al. |
| 2008/0108212 A1 | 5/2008 | Moss et al. |
| 2008/0123418 A1 | 5/2008 | Widjaja |
| 2008/0224202 A1 | 9/2008 | Young et al. |
| 2008/0265305 A1 | 10/2008 | He et al. |
| 2008/0303079 A1 | 12/2008 | Cho et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0173985 A1 | 7/2009 | Lee et al. |
| 2009/0190402 A1 | 7/2009 | Hsu et al. |
| 2009/0251966 A1 | 10/2009 | Widjaja |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0246277 A1 | 9/2010 | Widjaja |
| 2010/0246284 A1 | 9/2010 | Widjaja |
| 2011/0032756 A1 | 2/2011 | Widjaja |
| 2011/0042736 A1 | 2/2011 | Widjaja |
| 2011/0044110 A1 | 2/2011 | Widjaja |
| 2011/0228591 A1 | 9/2011 | Widjaja |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0081941 A1 | 4/2012 | Widjaja et al. |
| 2012/0113712 A1 | 5/2012 | Widjaja |
| 2012/0230123 A1 | 9/2012 | Widjaja et al. |
| 2013/0148422 A1 | 6/2013 | Widjaja |
| 2013/0250685 A1 | 9/2013 | Widjaja |
| 2014/0021549 A1 | 1/2014 | Widjaja |
| 2014/0159156 A1 | 6/2014 | Widjaja |
| 2014/0160868 A1 | 6/2014 | Widjaja et al. |
| 2014/0332899 A1 | 11/2014 | Widjaja |
| 2014/0355343 A1 | 12/2014 | Widjaja |
| 2015/0109860 A1 | 4/2015 | Widjaja |
| 2015/0371707 A1 | 12/2015 | Widjaja |
| 2016/0086655 A1 | 3/2016 | Widjaja |
| 2016/0111158 A1 | 4/2016 | Widjaja |
| 2017/0025534 A1 | 1/2017 | Widjaja |
| 2017/0040326 A1 | 2/2017 | Widjaja |
| 2017/0213593 A1 | 7/2017 | Widjaja |
| 2017/0365340 A1 | 12/2017 | Widjaja |
| 2017/0365607 A1 | 12/2017 | Widjaja |
| 2018/0174654 A1 | 6/2018 | Widjaja |
| 2018/0219013 A1 | 8/2018 | Widjaja |
| 2019/0156889 A1 | 5/2019 | Widjaja |
| 2019/0164974 A1 | 5/2019 | Widjaja |
| 2020/0243530 A1 | 7/2020 | Widjaja |
| 2021/0050059 A1 | 2/2021 | Widjaja |

OTHER PUBLICATIONS

Chatterjee, et al. Circuit Optimization of the Paper Isolated Dynamic Gain RAM Cell for VLSI Memories, pp. 22-23, 1979.

Chatterjee, et al. "a survey of high-density dynamic RAM cell concepts." Electron Devices, IEEE Transactions on 26.6 (1979): 827-839.

Erb, D. "Stratified charge memory." Solid-State Circuits Conference. Digest of Technical Papers. 1978 IEEE International. vol. 21. IEEE, 1978, pp. 24-25.

Leiss, et al, "dRAM Design Using the Taper-Isolated Dynamic RAM Cell." Solid-State Circuits, IEEE Journal of 17.2 (1982): 337-344.

Lin, et al., A new 1T DRAM Cell with enhanced Floating Body Effect, pp. 1-5, Proceeding of the 2006 IEEE International Workshop on Memory Technology.

Lanyon, et al., "Bandgap Narrowing in Moderately to Heavily Doped Silicon", ppl 1014-1018, No. 7, vol. ED-26, IEEE, 1979.

Ohsawa, et al. Autonomous refresh of floating body cell (FBC), IEEE 2008, pp. 801-804.

Oh, et al., a 4-Bit Double SONOS memory (DSM) with 4 Storage Nodes Per Cell for Ultimate Multi-Bit Operation, pp. 1-2, 2006, Symposium on VLSI Technology Digest of Technical Papers.

Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.

Reisch, "On bistable behavior and open-base breakdown of bipolar transistors in the avalanche regime-modeling and applications." Electron Devices IEEE Transactions on 39.6 (1992): 1398-1409.

Sakui, K., et al. "A new static memory cell based on the reverse base current effect of bipolar transistors." Electron Devices, IEEE Transactions on 36.6 (1989): 1215-1217.

Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.

Sze, et al. Physics of Semiconductor Devices, Wiley-Interscience, 2007, pp. 104.

Terada, et al. "A new VLSI memory cell using capacitance coupling (CC cell)." Electron Devices, IEEE Transactions on 31.9 (1984): pp. 1319-1324.

Villaret, et al. "Further insight into the physics and modeling of floating-body capacitorless DRAMs." Electron Devices, IEEE Transactions on 52.11 (2005): pp. 2447-2454.

Campardo, G. et al., VLSI Design of Non-Volatile Memories, Springer Berlin Heidelberg New York, 2005, pp. 94-95.

Han et al., Programming/Erasing Characteristics of 45 nm NOR-Type Flash Memory Based on SOI FinFET Structure. J. Korean Physical Society, vol. 47, Nov. 2005, pp. S564-S567.

Headland, Hot electron injection, Feb. 19, 2004, pp. 1-2.

Ohsawa et al., Memory Design Using One-Transistor Gain Cell on SOI, Tech . . . Digest IEEE International Solid-State4 Circuits, vol. 37, No. 11, 2002, pp. 1510-1522.

Ohsawa et al., An 18.5ns, 128Mb SOI DRAM with a Floating Body Cell, IEEE International Solid-State Circuits Conference, 2005, pp. 458-459, 609.

Okhonin et al., A Capacitor-less 1T-DRAM Cell, IEEE Electron Device Letters, vol. 23, No. 2, Feb. 2002, pp. 85-87.

Okhonin et al., A SOI Capacitor-less 1T-DRAM Concept, IEEE International SOI Conference, 2001, pp. 153-154.

Okhonin et al., Principles of Transient Charge Pumping on Partially Depleted SOI MOSFETs, IEEE Electron Device Letters, vol. 23, No. 5, May 2002, pp. 279-281.

Pellizzer et al, A 90nm Phase Change Memory Technology fro Stand-Alone Non-Volatile Memory Applications, 2006 Symposium on VLSI Tech. Digest of Tech. Papers, pp. 1-2, 2006.

Ranica et al., Scaled 1T-Bulk devices built with CMOS 90nm technology for low-cost eDRAM applications, 2005 Symposium on VLSI Tech. Digest of Tech. Papers, pp. 38-39, 2005.

Pierret, Semiconductor Device Fundamentals, ISBN: 0-201-54393-1, Addison-Wesley Publishing Co., Inc., PNPN Devices 463-476, 1996.

(56) References Cited

OTHER PUBLICATIONS

Tack et al., The Multistable Charge-Controlled Memory Effect in SOI Transistors at Low Temperatures, IEEE Transactions on Electron Devices, vol. 37, May 1990, pp. 1373-1382.
Yoshida et al., A Design of Capacitorless 1T-DRAM Cell Using Gate-Induced Drain Leakage (GIDL) Current for Low-power and High-speed Embedded Memory, International Electron Device Meeting, 2003, pp. 1-4.

* cited by examiner

| Operation | Terminal | | | | |
|---|---|---|---|---|---|
| | 70 | 72 | 74 | 76 | 78 |
| Read | Positive | Neutral | Positive | Neutral or Positive | Neutral |
| Read SCR | Positive | Float | Neutral | Float | Positive |
| Write '1' Hot hole injection | Negative | Neutral | Positive | Neutral or Positive | Neutral |
| Write '1' Impact ionization | Positive | Neutral | Positive | Neutral or Positive | Neutral |
| Write '1' Impact ionization | Positive | Neutral | Positive | Float | Positive |
| Write '1' SCR | Positive | Float | Neutral | Float | Positive |

FIG. 2A

| Operation | Terminal | | | | |
|---|---|---|---|---|---|
| | 70 | 72 | 74 | 76 | 78 |
| Write '0' | Neutral or Negative | Negative | Neutral | Neutral or Positive | Neutral |
| Write '0' SCR | Positive | Float | Positive | Float | Positive |
| Holding/Refresh | Neutral or Negative | Neutral | Float | Float | Positive |
| Holding/Refresh | Neutral or Negative | Float | Neutral | Float | Positive |

FIG. 2B

METHOD OF OPERATING SEMICONDUCTOR MEMORY DEVICE WITH FLOATING BODY TRANSISTOR USING SILICON CONTROLLED RECTIFIER PRINCIPLE

This application is a continuation application of application Ser. No. 16/846,692, filed Apr. 13, 2020, now U.S. Pat. No. 10,991,698, which issued on Apr. 27, 2021, which is a continuation application of application Ser. No. 16/242,430, filed Jan. 8, 2019, now U.S. Pat. No. 10,644,002, which issued on May 5, 2020, which is a continuation application of application Ser. No. 15/933,897, filed Mar. 23, 2018, now U.S. Pat. No. 10,211,209, which issued on Feb. 19, 2019, which is a continuation application of application Ser. No. 15/675,523, filed Aug. 11, 2017, now U.S. Pat. No. 9,960,166, which issued on May 1, 2018, which is a continuation application of application Ser. No. 15/290,996, filed Oct. 11, 2016, now U.S. Pat. No. 9,761,589, which issued on Sep. 12, 2017, which is a continuation application of application Ser. No. 14/956,103, filed Dec. 1, 2015, now U.S. Pat. No. 9,484,082, which issued on Nov. 1, 2016, which is a continuation application of application Ser. No. 14/444,109, filed Jul. 28, 2014, now U.S. Pat. No. 9,230,965, which issued on Jan. 5, 2016, which is a continuation application of application Ser. No. 14/023,246, filed Sep. 10, 2013, now U.S. Pat. No. 8,837,247, which issued on Sep. 16, 2014, which is a continuation application of application Ser. No. 13/244,916, filed Sep. 26, 2011, now U.S. Pat. No. 8,559,257 which issued on Oct. 15, 2013, which is a continuation application of application Ser. No. 12/533,661, filed Jul. 31, 2009, now U.S. Pat. No. 8,077,536, which issued on Dec. 13, 2011, and which claims the benefit of U.S. Provisional Application No. 61/086,170, filed Aug. 5, 2008, which applications and patents are each hereby incorporated herein, in their entireties, by reference thereto. We claim priority to application Ser. Nos. 16/846,692; 16/242,430; 15/933,897; 15/675,523; 15/290,996; 14/956,103; 14/444,109; 14/023,246; 13/244,916 and 12/533,661 under 35 U.S.C. Section 120 and claim priority to Application Ser. No. 61/086,170 under 35 U.S.C. Section 119.

FIELD OF THE INVENTION

The present invention relates to semiconductor memory technology. More specifically, the present invention relates to dynamic random access memory having an electrically floating body transistor.

BACKGROUND OF THE INVENTION

Semiconductor memory devices are used extensively to store data. Dynamic Random Access Memory (DRAM) is widely used in many applications. Conventional DRAM cells consist of a one-transistor and one-capacitor (1T/1C) structure. As the 1T/1C memory cell feature is being scaled, difficulties arise due to the necessity of maintaining the capacitance values of each memory scale in the scaled architecture.

There is a need in the art for improve DRAM memory that can better retain capacitance values in the cells of a scaled architecture comprising many DRAM memory cells. Because of the rapid growth in the amounts of memory used by modern electronic devices, there is a continuing need to provided improvement in DRAM architecture that allow for a smaller cell size than the currently available 1T/1C memory cell architecture.

Currently existing DRAM memory must be periodically refreshed to maintain the viability of the data stored therein, as the stored charges have a finite lifetime and begin to degrade after a period of time. The charges therefore need to be refreshed to their originally stored values. To do this, the data is first read out and then it is written back into the DRAM. This process must be repeated cyclically after each passage of a predetermined period of time, and is inefficient, as it is both time consuming and energy inefficient.

Thus, there is a need for DRAM memory that is both space efficient and can be efficiently refreshed.

The present inventions satisfies these needs as well as providing additional features that will become apparent upon reading the specification below with reference to the figures.

SUMMARY OF THE INVENTION

The present invention provides methods of operating semiconductor memory devices with floating body transistors, using a silicon controlled rectifier principle and also provide semiconductor memory devices for such operations.

A method of maintaining the data state of a semiconductor dynamic random access memory cell is provided, wherein the memory cell comprises a substrate being made of a material having a first conductivity type selected from p-type conductivity type and n-type conductivity type; a first region having a second conductivity type selected from the p-type and n-type conductivity types, the second conductivity type being different from the first conductivity type; a second region having the second conductivity type, the second region being spaced apart from the first region; a buried layer in the substrate below the first and second regions, spaced apart from the first and second regions and having the second conductivity type; a body region formed between the first and second regions and the buried layer, the body region having the first conductivity type; and a gate positioned between the first and second regions and adjacent the body region. The memory cell is configured to store a first data state which corresponds to a first charge in the body region in a first configuration, and a second data state which corresponds to a second charge in the body region in a second configuration. The method includes: providing the memory cell storing one of the first and second data states; and applying a positive voltage to a substrate terminal connected to the substrate beneath the buried layer, wherein when the body region is in the first state, the body region turns on a silicon controlled rectifier device of the cell and current flows through the device to maintain configuration of the memory cell in the first memory state, and wherein when the memory cell is in the second state, the body region does not turn on the silicon controlled rectifier device, current does not flow, and a blocking operation results, causing the body to maintain the second memory state.

In at least one embodiment, the memory cell includes, in addition to the substrate terminal, a source line terminal electrically connected to one of the first and second regions; a bit line terminal electrically connected to the other of the first and second regions; a word line terminal connected to the gate; and a buried well terminal electrically connected to the buried layer; the method further comprising: applying a substantially neutral voltage to the bit line terminal; applying a negative voltage to the word line terminal; and allowing the source line terminal and the buried well terminal to float.

In at least one embodiment, the memory cell includes, in addition to the substrate terminal, a source line terminal electrically connected to one of the first and second regions; a bit line terminal electrically connected to the other of the first and second regions; a word line terminal connected to the gate; and a buried well terminal electrically connected to the buried layer; the method further comprising: applying a substantially neutral voltage to the source line terminal; applying a negative voltage to the word line terminal; and allowing the bit line terminal and the buried well terminal to float.

A method of reading the data state of a semiconductor dynamic random access memory cell is provided, wherein the memory cell comprises a substrate being made of a material having a first conductivity type selected from p-type conductivity type and n-type conductivity type; a first region having a second conductivity type selected from the p-type and n-type conductivity types, the second conductivity type being different from the first conductivity type; a second region having the second conductivity type, the second region being spaced apart from the first region; a buried layer in the substrate below the first and second regions, spaced apart from the first and second regions and having the second conductivity type; a body region formed between the first and second regions and the buried layer, the body region having the first conductivity type; and a gate positioned between the first and second regions and adjacent the body region. The memory cell further comprises a substrate terminal electrically connected to the substrate, a source line terminal electrically connected to one of the first and second regions, a bit line terminal electrically connected to the other of the first and second regions, a word line terminal connected to the gate, and a buried well terminal electrically connected to the buried layer; wherein each memory cell is configured to store a first data state which corresponds to a first charge in the body region in a first configuration, and a second data state which corresponds to a second charge in the body region in a second configuration. The method includes: applying a positive voltage to the substrate terminal; applying a positive voltage to the word line terminal; applying a substantially neutral voltage to the bit line terminal; and allowing voltage levels of the source line terminal and the buried well terminal to float; wherein, when the memory cell is in the first data state, a silicon controlled rectifier device is formed by the substrate, buried well, body region and region connected to the bit line terminal is in low-impedance, conducting mode, and a higher cell current is observed at the bit line terminal compared to when the memory cell is in the second data state, as when the memory cell is in the second data state, the silicon rectifier device is in blocking mode.

A semiconductor memory array is provided, including: a plurality of semiconductor dynamic random access memory cells arranged in a matrix of rows and columns, each semiconductor dynamic random access memory cell including: a substrate having a top surface, the substrate being made of a material having a first conductivity type selected from p-type conductivity type and n-type conductivity type; a first region having a second conductivity type selected from the p-type and n-type conductivity types, the second conductivity type being different from the first conductivity type, the first region being formed in the substrate and exposed at the top surface; a second region having the second conductivity type, the second region being formed in the substrate, spaced apart from the first region and exposed at the top surface; a buried layer in the substrate below the first and second regions, spaced apart from the first and second regions and having the second conductivity type; a body region formed between the first and second regions and the buried layer, the body region having the first conductivity type; and a gate positioned between the first and second regions and above the top surface; a source line terminal electrically connected to one of the first and second regions; a bit line terminal electrically connected to the other of the first and second regions; a word line terminal connected to the gate; a buried well terminal electrically connected to the buried layer; and a substrate terminal electrically connected to the substrate below the buried layer; wherein each memory cell further includes a first data state which corresponds to a first charge in the body region, and a second data state which corresponds to a second charge in the body region; wherein each of the terminals is controlled to perform operations on each the cell; and wherein the terminals are controlled to perform a refresh operation by a non-algorithmic process.

In at least one embodiment, the data state of at least one of the cells is read by: applying a neutral voltage state to the substrate terminal, applying a voltage greater than or equal to zero to the buried well terminal, applying a neutral voltage to the source line terminal, applying a positive voltage to the bit line terminal and applying a positive voltage to the word line terminal.

In at least one embodiment, the data state of at least one of the cells is read by: applying a positive voltage to the substrate terminal, applying a neutral voltage to the bit line terminal, applying a positive voltage to the word line terminal and leaving the source line terminal and the buried well terminal floating.

In at least one embodiment, the first data state is written to at least one of the cells by: applying a positive voltage to the bit line terminal, applying a neutral voltage to the source line terminal, applying a negative voltage to the word line terminal, applying a positive voltage to the buried well terminal and applying a neutral voltage to the substrate terminal.

In at least one embodiment, the first data state is written to at least one of the cells by: applying a positive voltage to the substrate terminal, applying a neutral voltage to the source line terminal, applying a positive voltage to the bit line terminal, applying a positive voltage to the word line terminal and allowing the buried well terminal to float.

In at least one embodiment, the first data state is written to at least one of the cells by: applying a neutral voltage to the bit line terminal, applying a positive voltage to the word line terminal, applying a positive voltage to the substrate terminal and allowing the source line terminal and the buried well terminal to float.

In at least one embodiment, the second data state is written to at least one of the cells by: applying a negative voltage to the source line terminal, applying a voltage less than or equal to about zero to the word line terminal, applying a neutral voltage to the substrate terminal, applying a voltage greater than or equal to zero to the buried well terminal, and applying a neutral voltage to the bit line terminal.

In at least one embodiment, the second data state is written to at least one of the cells by: applying a positive voltage to the bit line terminal, applying a positive voltage to the word line terminal, applying a positive voltage to the substrate terminal, while allowing the source line terminal and the buried well terminal to float.

In at least one embodiment, a holding operation is performed on at least one of the cells by: applying a substantially neutral voltage to the bit line terminal, applying a neutral or negative voltage to the word line terminal, and applying a positive voltage to the substrate terminal, while allowing the source line terminal and the buried well terminal to float.

A semiconductor memory array is provided, including: a plurality of semiconductor dynamic random access memory cells arranged in a matrix of rows and columns, each semiconductor dynamic random access memory cell including: a substrate being made of a material having a first conductivity type selected from p-type conductivity type and n-type conductivity type; a first region having a second conductivity type selected from the p-type and n-type conductivity types, the second conductivity type being different from the first conductivity type; a second region having the second conductivity type, the second region being spaced apart from the first region; a buried layer in the substrate below the first and second regions, spaced apart from the first and second regions and having the second conductivity type; a body region formed between the first and second regions and the buried layer, the body region having the first conductivity type; and a gate positioned between the first and second regions and adjacent the body region; wherein each memory cell further includes a first data state which corresponds to a first charge in the body region, and a second data state which corresponds to a second charge in the body region; wherein the substrates of a plurality of the cells are connected to a same substrate terminal; and wherein data states of the plurality of cells are maintained by biasing the substrate terminal.

In at least one embodiment, the cells are refreshed by a non-algorithmic process.

In at least one embodiment, the voltage applied to the substrate terminal automatically activates each cell of the plurality of cells that has the first data state to refresh the first data state, and wherein each cell of the plurality of cells that has the second data state automatically remains deactivated upon application of the voltage to the substrate terminal so that each the cell having the second data state remains in the second data state.

In at least one embodiment, the substrate terminal is periodically biased by pulsing the substrate terminal and wherein the data states of the plurality of cells are refreshed upon each the pulse.

In at least one embodiment, the substrate terminal is constantly biased and the plurality of cells constantly maintain the data states.

In at least one embodiment, the substrate has a top surface, the first region is formed in the substrate and exposed at the top surface; wherein the second region is formed in the substrate and exposed at the top surface; and wherein the gate is positioned above the top surface.

In at least one embodiment, the first and second regions are formed in a fin that extends above the buried layer, the gate is provided on opposite sides of the fin, between the first and second regions, and the body region is between the first and second regions and between the gate on opposite sides of the fin.

In at least one embodiment, the gate is additionally provided adjacent a top surface of the body region.

These and other features of the invention will become apparent to those persons skilled in the art upon reading the details of the devices and methods as more fully described below.

BRIEF DESCRIPTION OF THE DRAWINGS

FIGS. 2A-2B illustrate various voltage states applied to terminals of a memory cell or plurality of memory cells, to carry out various functions according to various embodiments of the present invention.

DETAILED DESCRIPTION OF THE INVENTION

Figure 1:
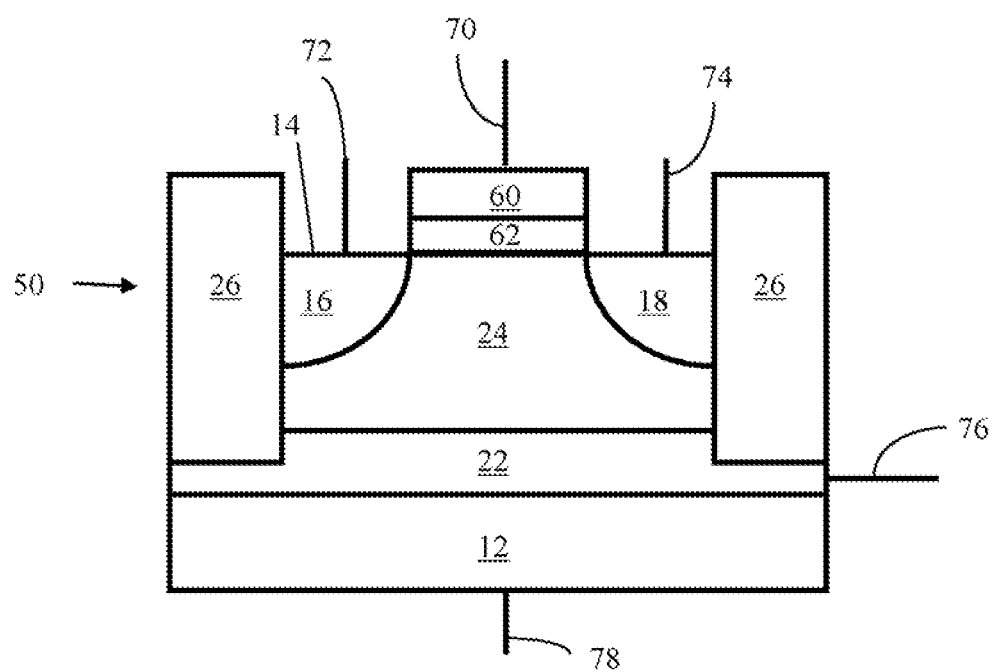
FIG. 1 is a cross-sectional, schematic view of a memory cell according to an embodiment of the present invention.

Before the present devices and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a memory cell" includes a plurality of such memory cells and reference to "the device"

includes reference to one or more devices and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

When a terminal is referred to as being "left floating", this means that the terminal is not held to any specific voltage, but is allowed to float to a voltage as driven by other electrical forces with the circuit that it forms a part of.

The term "refresh" or "refresh operation" refers to a process of maintaining charge (and the corresponding data) of a memory cell, typically a dynamic random access memory (DRAM) cell. Periodic refresh operations of a DRAM cell are required because the stored charge leaks out over time.

Description

The present invention provides capacitorless DRAM memory cells that are refreshable by a non-algorithmic process. Alternatively, the memory cells may be operated to maintain memory states without the need to refresh the memory states, similar to SRAM memory cells.

FIG. 1 shows an embodiment of a memory cell 50 according to the present invention. The cell 50 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a second conductivity type, such as n-type, for example, is provided in substrate 12 and is exposed at surface 14. A second region 18 having the second conductivity type is also provided in substrate 12, and is also exposed at surface 14. Second region 18 is spaced apart from the first region 16, as shown. First and second regions 16 and 18 are formed by an implantation process formed on the material making up substrate 12, according to any of implantation processes known and typically used in the art.

A buried layer 22 of the second conductivity type is also provided in the substrate 12, buried in the substrate 12, as shown. Buried layer 22 is also formed by an ion implantation process on the material of substrate 12. A body region 24 of the substrate 12 is bounded by surface 14, first and second regions 16, 18, insulating layers 26 and buried layer 22. Insulating layers 26 (e.g., shallow trench isolation (STI)), may be made of silicon oxide, for example. Insulating layers 26 insulate cell 50 from neighboring cells 50 when multiple cells 50 are joined in an array 80 to make a memory device. A gate 60 is positioned in between the regions 16 and 18, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

Cell 50 further includes word line (WL) terminal 70 electrically connected to gate 60, source line (SL) terminal 72 electrically connected to one of regions 16 and 18 (connected to 16 as shown, but could, alternatively, be connected to 18), bit line (BL) terminal 74 electrically connected to the other of regions 16 and 18, buried well (BW) terminal 76 electrically connected to buried layer 22, and substrate terminal 78 electrically connected to substrate 12 at a location beneath buried layer 22.

FIG. 2 illustrates relative voltages that can be applied to the terminals of memory cell 50 to perform various operations. For a read operation, a neutral voltage (i.e., about zero volts) is applied to the substrate terminal 78, a neutral or positive voltage (greater than or equal to about zero volts) is applied to the BW terminal 76, a neutral voltage (about zero volts) is applied to SL terminal 72, a positive voltage is applied to BL terminal 74, and a positive voltage is applied to WL terminal 70, with the voltage at terminal 70 being more positive (higher voltage) that the voltage applied to terminal 74. If cell 50 is in a state "1" having holes in the body region 24, then a lower threshold voltage (gate voltage where the transistor is turned on) is observed compared to the threshold voltage observed when cell 50 is in a state "0" having no holes in body region 24. In one particular non-limiting embodiment, about 0.0 volts is applied to terminal 72, about +0.4 volts is applied to terminal 74, about +1.2 volts is applied to terminal 70, about +0.6 volts is applied to terminal 76, and about 0.0 volts is applied to terminal 78. However, these voltage levels may vary.

Alternatively, a neutral voltage is applied to the substrate terminal 78, a neutral or positive voltage is applied to the BW terminal 76, a neutral voltage is applied to SL terminal 72, a positive voltage is applied to BL terminal 74, and a positive voltage is applied to WL terminal 70, with the voltage at terminal 74 being more positive (higher voltage) that the voltage applied to terminal 70. If cell 50 is in a state "1" having holes in the body region 24, then the parasitic bipolar transistor formed by the SL terminal 72, floating body 24, and BL terminal 74 will be turned on and a higher cell current is observed compared to when cell 50 is in a state "0" having no holes in body region 24. In one particular non-limiting embodiment, about 0.0 volts is applied to terminal 72, about +3.0 volts is applied to terminal 74, about +0.5 volts is applied to terminal 70, about +0.6 volts is applied to terminal 76, and about 0.0 volts is applied to terminal 78. However, these voltage levels may vary.

Alternatively, a positive voltage is applied to the substrate terminal 78, a substantially neutral voltage is applied to BL terminal 74, and a positive voltage is applied to WL terminal 70. The SL terminal 72 and the BW terminal 76 are left floating, as shown in FIG. 2. Cell 50 provides a P1-N2-P3-N4 silicon controlled rectifier device, with substrate 78 functioning as the P1 region, buried layer 22 functioning as the N2 region, body region 24 functioning as the P3 region and region 16 or 18 functioning as the N4 region. In this example, the substrate terminal 78 functions as the anode and terminal 72 or terminal 74 functions as the cathode, while body region 24 functions as a p-base to turn on the SCR device. If cell 50 is in a state "1" having holes in the body region 24, the silicon controlled rectifier (SCR) device formed by the substrate, buried well, floating body, and the BL junction will be turned on and a higher cell current is observed compared to when cell 50 is in a state "0" having no holes in body region 24. A positive voltage is applied to WL terminal 70 to select a row in the memory cell array 80 (e.g., see FIGS. 9-10), while negative voltage is applied to WL terminal 70 for any unselected rows. The negative voltage applied reduces the potential of floating body 24 through capacitive coupling in the unselected rows and turns off the SCR device of each cell 50 in each unselected row. In one particular non-limiting embodiment, about +0.8 volts is applied to terminal 78, about +0.5 volts is applied to terminal 70 (for the selected row), and about 0.0 volts is applied to terminal 74. However, these voltage levels may vary.

Figure 3:
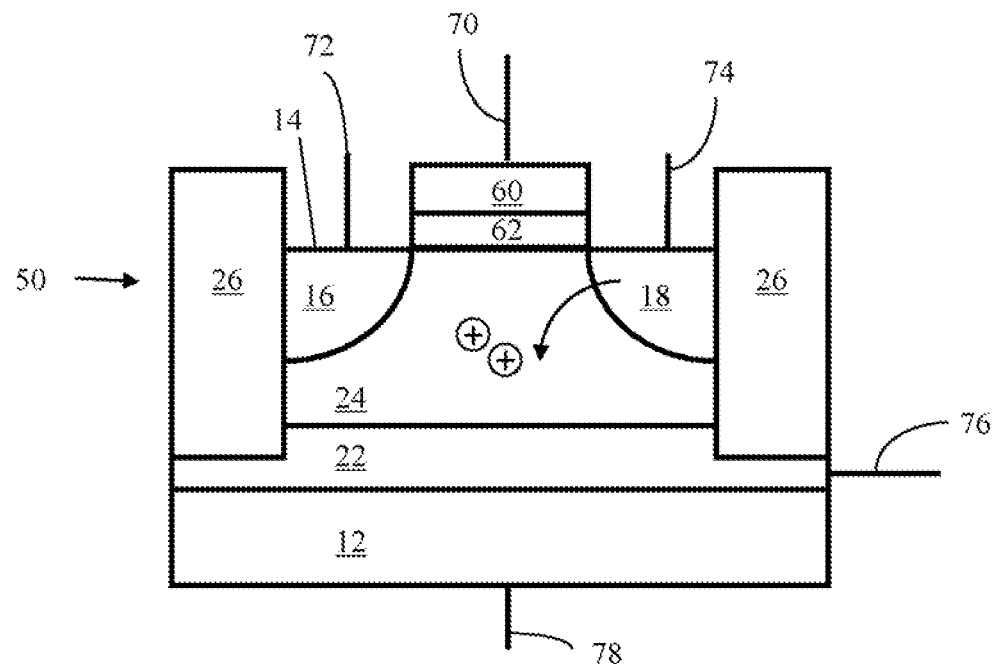
FIG. 3 illustrates an operating condition for a write state "1" operation that can be carried out on a memory cell according to an embodiment of the present invention.

FIG. 3 illustrate a write state "1" operation that can be carried out on cell 50 according to an embodiment of the invention, by performing band-to-band tunneling hot hole injection or impact ionization hot hole injection. To write state "1" using band-to-band tunneling mechanism, the following voltages are applied to the terminals: a positive voltage is applied to BL terminal 74, a neutral voltage is applied to SL terminal 72, a negative voltage is applied to WL terminal 70, a positive voltage is applied to BW terminal 76, and a neutral voltage is applied to the substrate terminal 78. Under these conditions, holes are injected from BL terminal 74 into the floating body region 24, leaving the body region 24 positively charged. In one particular non-limiting embodiment, a charge of about 0.0 volts is applied to terminal 72, a voltage of about +2.0 volts is applied to terminal 74, a voltage of about −1.2 volts is applied to terminal 70, a voltage of about +0.6 volts is applied to terminal 76, and about 0.0 volts is applied to terminal 78. However, these voltage levels may vary.

Alternatively, to write state "1" using impact ionization mechanism, the following voltages are applied to the terminals: a positive voltage is applied to BL terminal 74, a neutral voltage is applied to SL terminal 72, a positive voltage is applied to WL terminal 70, a positive voltage less than the positive voltage applied to BL terminal 74 is applied to BW terminal 76, and a neutral voltage is applied to the substrate terminal 78. Under these conditions, holes are injected from BL terminal 74 into the floating body region 24, leaving the body region 24 positively charged. In one particular non-limiting embodiment, +0.0 volts is applied to terminal 72, a voltage of about +2.0 volts is applied to terminal 74, a charge of about +0.5 volts is applied to terminal 70, a charge of about +0.6 volts is applied to terminal 76, and about 0.0 volts is applied to terminal 78. However, these voltage levels may vary.

In an alternate write state "1" using impact ionization mechanism, a positive bias can be applied to substrate terminal 78, a positive voltage greater than or equal to the positive voltage applied to substrate terminal 78 is applied to BL terminal 74, a neutral voltage is applied to SL terminal 72, a positive voltage is applied to WL terminal 70, while the BW terminal 76 is left floating. The parasitic silicon controlled rectifier device of the selected cell is now turned off due to the negative potential between the substrate terminal 78 and the BL terminal 74. Under these conditions, electrons will flow near the surface of the transistor, and generate holes through the impact ionization mechanism. The holes are subsequently injected into the floating body region 24. In one particular non-limiting embodiment, about +0.0 volts is applied to terminal 72, a voltage of about +2.0 volts is applied to terminal 74, a voltage of about +0.5 volts is applied to terminal 70, and about +0.8 volts is applied to terminal 78, while terminal 76 is left floating. However, these voltage levels may vary, while maintaining the relative relationships between the charges applied, as described above.

Alternatively, the silicon controlled rectifier device of cell 50 can be put into a state "1" (i.e., by performing a write "1" operation) by applying the following bias: a neutral voltage is applied to BL terminal 74, a positive voltage is applied to WL terminal 70, and a positive voltage is applied to the substrate terminal 78, while SL terminal 72 and BW terminal 76 are left floating. The positive voltage applied to the WL terminal 70 will increase the potential of the floating body 24 through capacitive coupling and create a feedback process that turns the SCR device on. Once the SCR device of cell 50 is in conducting mode (i.e., has been "turned on") the SCR becomes "latched on" and the voltage applied to WL terminal 70 can be removed without affecting the "on" state of the SCR device. In one particular non-limiting embodiment, a voltage of about 0.0 volts is applied to terminal 74, a voltage of about +0.5 volts is applied to terminal 70, and about +3.0 volts is applied to terminal 78. However, these voltage levels may vary, while maintaining the relative relationships between the voltages applied, as described above, e.g., the voltage applied to terminal 78 remains greater than the voltage applied to terminal 74.

Figure 4:
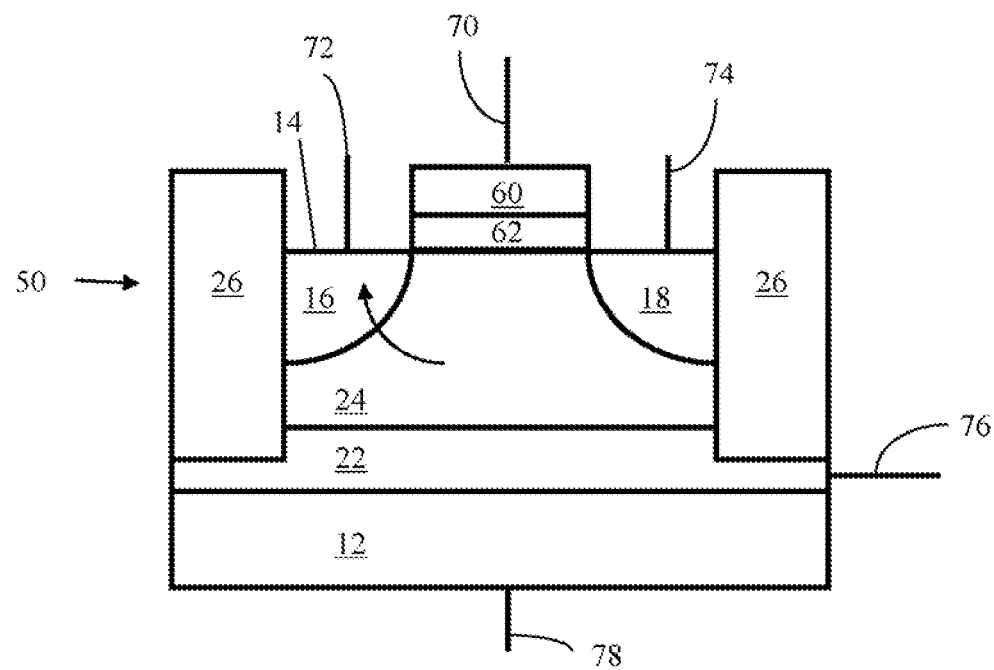
FIG. 4 illustrates an operating condition for a write state "0" operation that can be carried out on a memory cell according to an embodiment of the present invention.

A write "0" operation of the cell 50 is now described with reference to FIG. 2B and FIG. 4. To write "0" to cell 50, a negative bias is applied to SL terminal 72, a neutral voltage is applied to BL terminal 74, a neutral or negative voltage is applied to WL terminal 70, a neutral or positive voltage is applied to BW terminal 76 and a neutral voltage is applied to substrate terminal 78. Under these conditions, the p-n junction (junction between 24 and 18) is forward-biased, evacuating any holes from the floating body 24. In one particular non-limiting embodiment, about −2.0 volts is applied to terminal 72, about −1.2 volts is applied to terminal 70, about 0.0 volts is applied to terminal 74, about +0.6 volts is applied to terminal 76 and about 0.0 volts is applied to terminal 78. However, these voltage levels may vary, while maintaining the relative relationships between the charges applied, as described above. Alternatively, the voltages applied to terminals 72 and 74 may be switched.

Alternatively, a write "0" operation can be performed by putting the silicon controlled rectifier device into the blocking mode. This can be performed by applying the following bias: a positive voltage is applied to BL terminal 74, a positive voltage is applied to WL terminal 70, and a positive voltage is applied to the substrate terminal 78, while leaving SL terminal 72 and BW terminal 76 floating. Under these conditions the voltage difference between anode and cathode, defined by the voltages at substrate terminal 78 and BL terminal 74, will become too small to maintain the SCR device in conducting mode. As a result, the SCR device of cell 50 will be turned off. In one particular non-limiting embodiment, a voltage of about +0.8 volts is applied to terminal 74, a voltage of about +0.5 volts is applied to terminal 70, and about +0.8 volts is applied to terminal 78. However, these voltage levels may vary, while maintaining the relative relationships between the charges applied, as described above.

Figure 5:
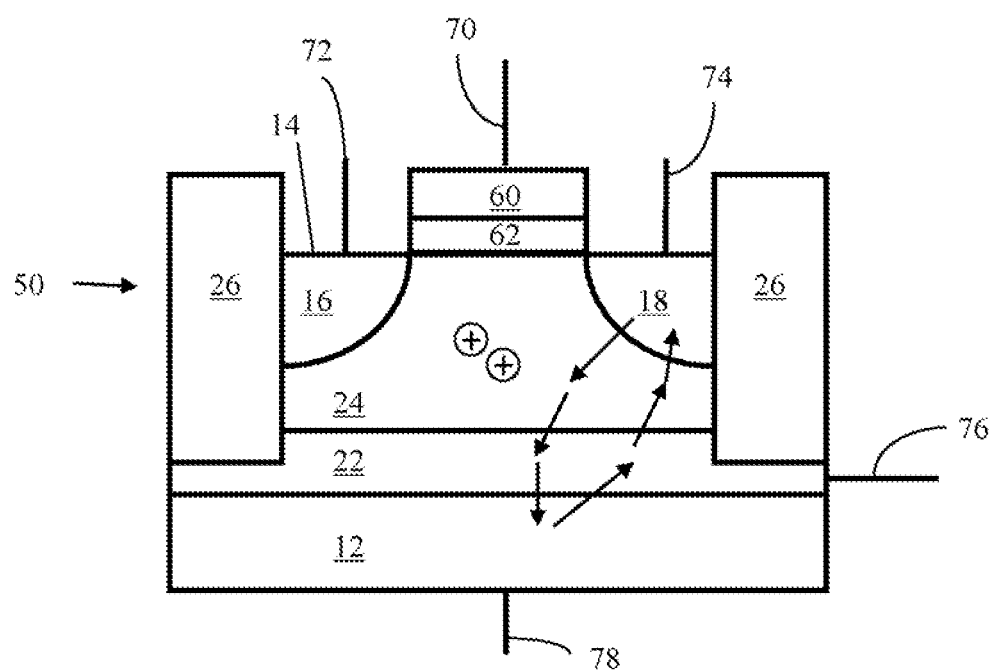
FIG. 5 illustrates a holding operation that can be carried out on a memory cell according to an embodiment of the present invention.

A holding or standby operation is described with reference to FIGS. 2B and 5. Such holding or standby operation is implemented to enhance the data retention characteristics of the memory cells 50. The holding operation can be performed by applying the following bias: a substantially neutral voltage is applied to BL terminal 74, a neutral or negative voltage is applied to WL terminal 70, and a positive voltage is applied to the substrate terminal 78, while leaving SL terminal 72 and BW terminal 76 floating. Under these conditions, if memory cell 50 is in memory/data state "1" with positive voltage in floating body 24, the SCR device of memory cell 50 is turned on, thereby maintaining the state "1" data. Memory cells in state "0" will remain in blocking mode, since the voltage in floating body 24 is not substantially positive and therefore floating body 24 does not turn on the SCR device. Accordingly, current does not flow through the SCR device and these cells maintain the state "0" data. In this way, an array of memory cells 50 can be refreshed by periodically applying a positive voltage pulse through substrate terminal 78. Those memory cells 50 that are commonly connected to substrate terminal 78 and which have a positive voltage in body region 24 will be refreshed with a "1" data state, while those memory cells 50 that are commonly connected to the substrate terminal 78 and which do not have a positive voltage in body region 24 will remain in blocking mode, since their SCR device will not be turned on, and therefore memory state "0" will be maintained in those cells. In this way, all memory cells 50 commonly connected to the substrate terminal will be maintained/refreshed to accurately hold their data states. This process occurs automatically, upon application of voltage to the substrate terminal 78, in a parallel, non-algorithmic, efficient process. In one particular non-limiting embodiment, a voltage of about 0.0 volts is applied to terminal 74, a voltage of about −1.0 volts is applied to terminal 70, and about +0.8 volts is applied to terminal 78. However, these voltage levels may vary, while maintaining the relative relationships therebetween. Alternatively, the voltages applied to terminals 72 and 74 may be reversed.

Figure 6:
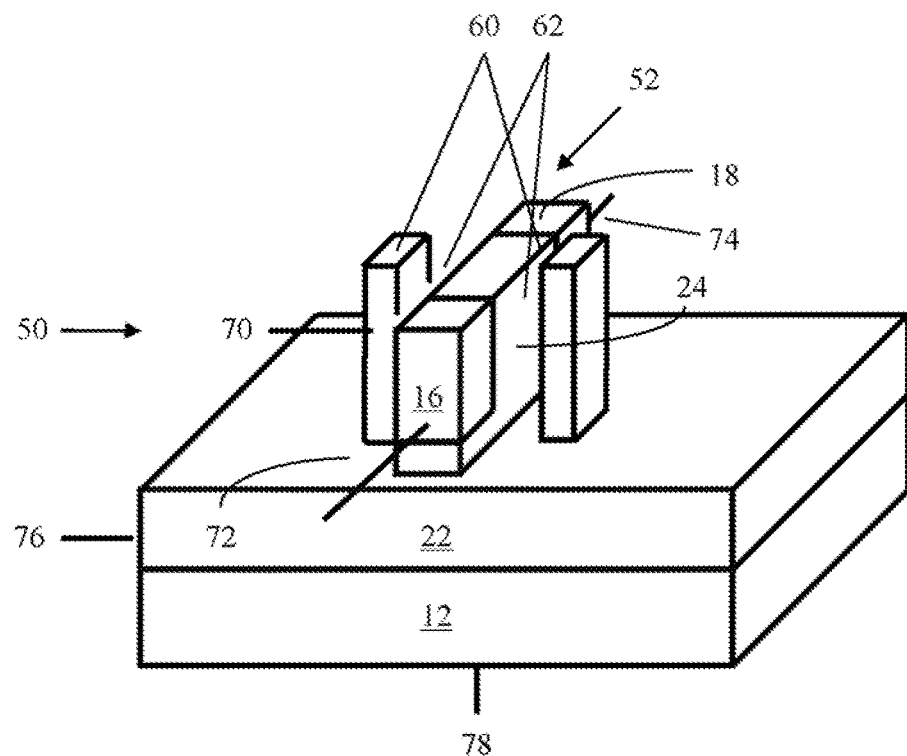
FIGS. 6-7 illustrate cross-sectional schematic illustrations of fin-type semiconductor memory cell devices according to embodiments of the present invention FIG. 8 illustrate a top view of a fin-type semiconductor memory cell device according to the embodiment shown in FIG. 6.
Figure 7:
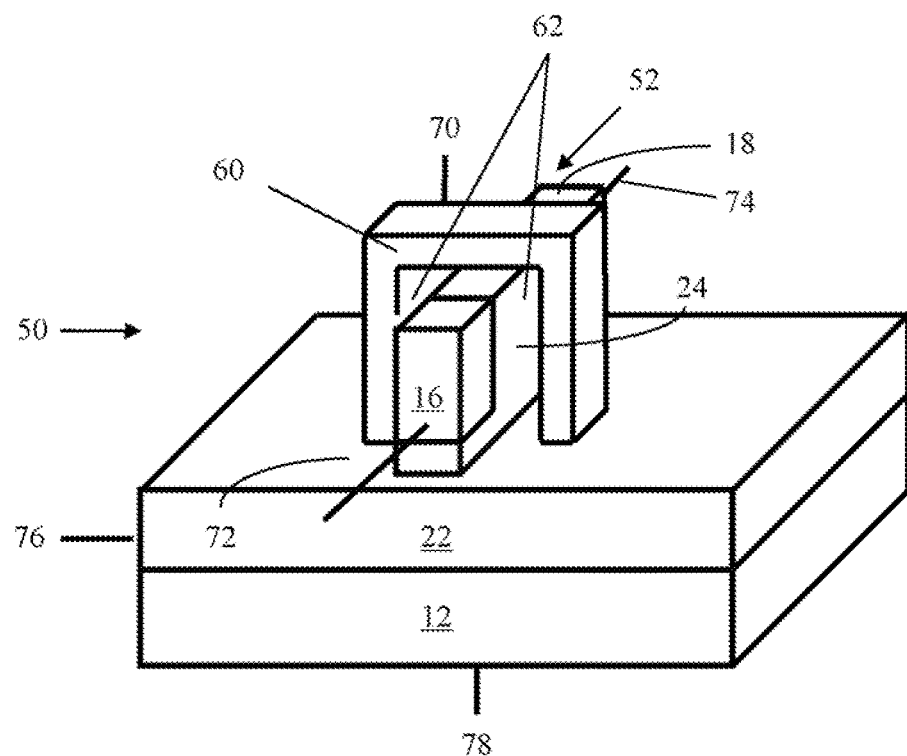
Figure 8:
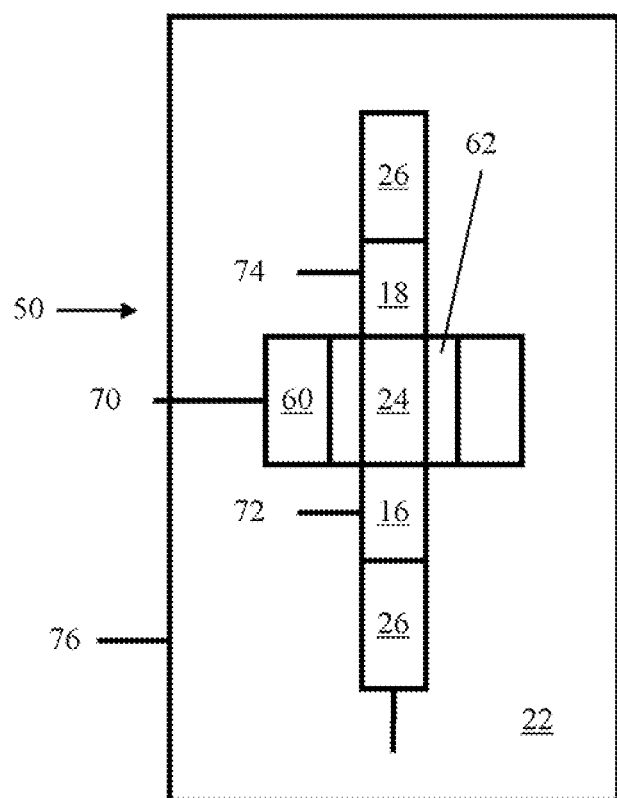

FIGS. 6-8 show another embodiment of memory cell 50 according to the present invention. In this embodiment, cell 50 has a fin structure 52 fabricated on substrate 12, so as to extend from the surface of the substrate to form a three-dimensional structure, with fin 52 extending substantially perpendicularly to, and above the top surface of the substrate 12. Fin structure 52 is conductive and is built on buried well layer 22. Region 22 is also formed by an ion implantation process on the material of substrate 12. Buried well layer 22 insulates the floating substrate region 24, which has a first conductivity type, from the bulk substrate 12. Fin structure 52 includes first and second regions 16, 18 having a second conductivity type. Thus, the floating body region 24 is bounded by the top surface of the fin 52, the first and second regions 16, 18 the buried well layer 22, and insulating layers 26 (see insulating layers 26 in FIG. 8). Insulating layers 26 insulate cell 50 from neighboring cells 50 when multiple cells 50 are joined to make a memory device. Fin 52 is typically made of silicon, but may comprise germanium, silicon germanium, gallium arsenide, carbon nanotubes, or other semiconductor materials known in the art.

Device 50 further includes gates 60 on two opposite sides of the floating substrate region 24 as shown in FIG. 6. Alternatively, gates 60 can enclose three sides of the floating substrate region 24 as shown in FIG. 7. Gates 60 are insulated from floating body 24 by insulating layers 62. Gates 60 are positioned between the first and second regions 16, 18, adjacent to the floating body 24.

Device 50 includes several terminals: word line (WL) terminal 70, source line (SL) terminal 72, bit line (BL) terminal 74, buried well (BW) terminal 76 and substrate terminal 78. Terminal 70 is connected to the gate 60. Terminal 72 is connected to first region 16 and terminal 74 is connected to second region 18. Alternatively, terminal 72 can be connected to second region 18 and terminal 74 can be connected to first region 16. Terminal 76 is connected to buried layer 22 and terminal 78 is connected to substrate 12. FIG. 8 illustrates the top view of the memory cell 50 shown in FIG. 6.

Figure 9:
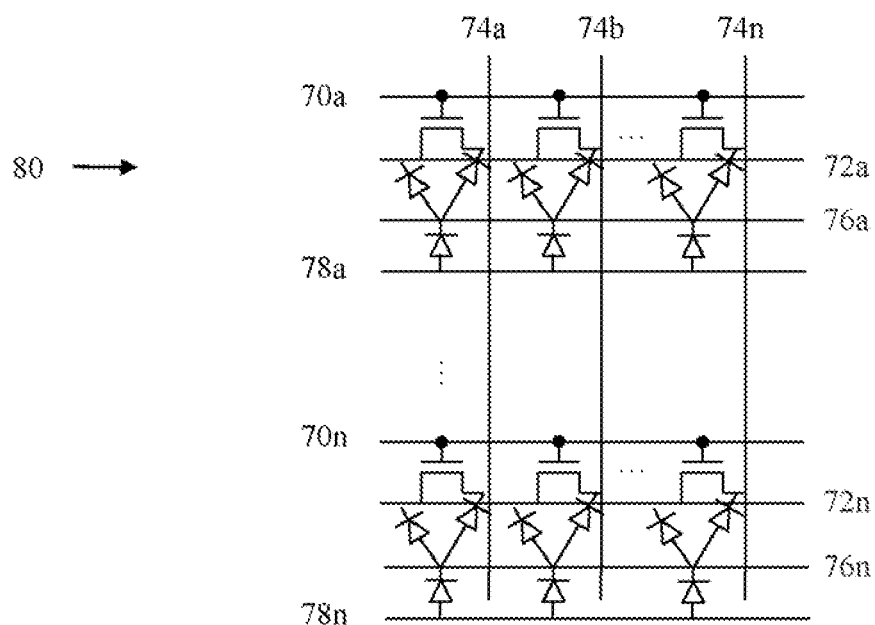
FIG. 9 is a schematic diagram showing an example of array architecture of a plurality memory cells according to an embodiment of the present invention.
Figure 10:
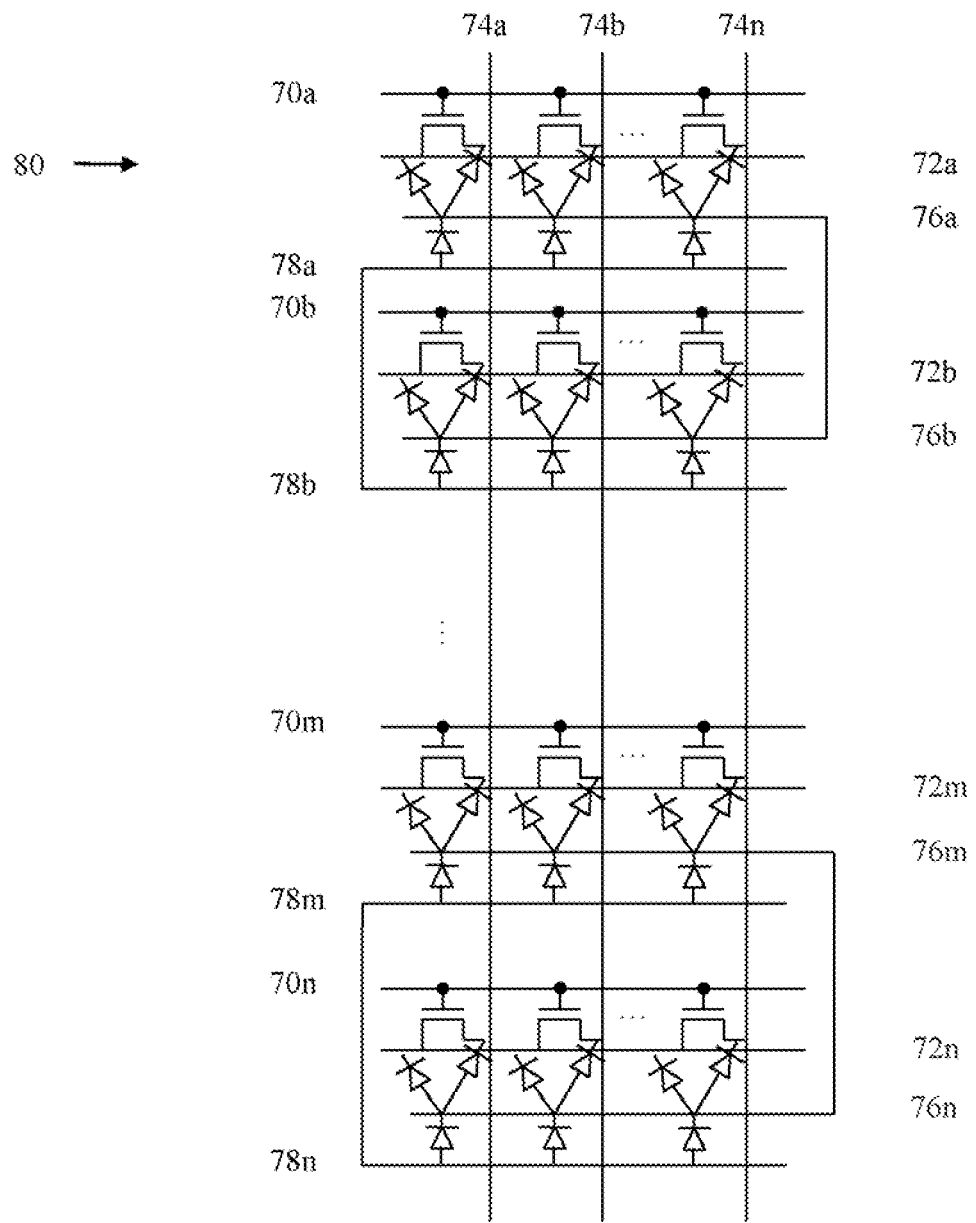
FIG. 10 is a schematic diagram showing an example of array architecture of a plurality memory cells according to another embodiment of the present invention.

FIG. 9 shows an example of array architecture 80 of a plurality of memory cells 50 arranged in a plurality of rows and columns according to an embodiment of the present invention. The memory cells 50 are connected such that within each row, all of the gates 60 are connected by a common word line terminal 70. The first regions 16 within the same row are also connected by a common source line 72. Within each column, the second regions 18 are connected to a common bit line terminal 74. Within each row, all of the buried layers 22 are connected by a common buried word terminal 76. Likewise, within each row, all of the substrates 12 are connected by a common substrate terminal 78.

In one embodiment, the buried layer 76 or the substrate 78 can be segmented (e.g., see FIG. 10) to allow independent control of the applied bias on the selected portion of the memory array. For example, the buried layer terminals 76*a* and 76*b* are connected together to form a segment independent of the segment defined by common buried layer terminals 76*m* and 76*n* in FIG. 10. Similarly, the substrate terminals 78*a* and 78*b* can form a segment that can be biased independently from other segments, for example, the segment defined by substrate terminals 78*m* and 78*n*. This array segmentation allows one segment of the memory array 80 to perform one operation (e.g., read), while the other segments perform another operation (e.g., holding).

From the foregoing it can be seen that with the present invention, a semiconductor memory with electrically floating body is achieved, and that this memory can be operated to perform non-algorithmic refreshment of the data stored in such memory. Additionally, such restore operations can be performed on the memory cells automatically, in parallel. The present invention also provides the capability of maintaining memory states without the need for periodic refresh operations by application of a constant positive bias to the substrate terminal. As a result, memory operations can be performed in an uninterrupted manner. While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

That which is claimed is:

1. A semiconductor memory cell comprising:
   a first silicon controlled rectifier device having a first region, a first floating body region, a first buried layer region, and a first substrate region;
   a second silicon controlled rectifier device having a second region, a second floating body region, a second buried layer region, and a second substrate region; and
   a transistor comprising said first region, said first floating body region, said second region, and a gate;
   wherein said first floating body region is common to said second floating body region;
   wherein said first buried layer region is common to said second buried layer region;
   wherein said first substrate region is common to said second substrate region;
   wherein said transistor is usable to access said semiconductor memory cell;
   wherein at least one of said first or second silicon controlled rectifier devices maintains a state of said semiconductor memory cell; and
   wherein said state of said semiconductor memory cell is maintained while memory operations can be performed in an uninterrupted manner.

2. The semiconductor memory cell of claim 1, wherein said first floating body region and said second floating body region have a first conductivity type selected from a p-type conductivity type and an n-type conductivity type;

wherein said first region and said second region have a second conductivity type selected from said p-type conductivity type and said n-type conductivity type, said second conductivity type being different from said first conductivity type;

wherein said first buried layer region and said second buried layer region have said second conductivity type; and wherein said first substrate region and said second substrate region have said first conductivity type.

3. The semiconductor memory cell of claim 1, wherein said first and second floating body regions comprise side surfaces, said semiconductor memory cell further comprising insulating layers bounding said side surfaces.

4. The semiconductor memory cell of claim 1, wherein said state of said semiconductor memory cell is maintained through a positive voltage applied to said first and second substrate regions.

5. The semiconductor memory cell of claim 4, wherein said positive voltage applied to said first and second substrate regions is a constant positive voltage.

6. The semiconductor memory cell of claim 4, wherein said positive voltage applied to said first and second substrate regions is a periodic pulse of positive voltage.

7. The semiconductor memory cell of claim 1, wherein said state of said semiconductor memory cell is stored in said first floating body region and said second floating body region.

8. The semiconductor memory cell of claim 7, wherein a maximum potential that can be stored in said first and second floating body regions is increased by applying a positive voltage to said first and second substrate regions, resulting in a relatively larger memory window.

9. The semiconductor memory cell of claim 1, wherein said first and second floating body regions and said first and second regions are formed in a fin that extends above said first and second buried layer regions, and said first and second floating body regions are between said first and second regions.

10. A semiconductor memory array comprising:
a plurality of semiconductor memory cells arranged in a matrix of rows and columns, wherein each of said plurality of semiconductor memory cells comprises:
a first silicon controlled rectifier device having a first region, a first floating body region, a first buried layer region, and a first substrate region;
a second silicon controlled rectifier device having a second region, a second floating body region, a second buried layer region, and a second substrate region;
a transistor comprising said first region, said first floating body region, said second region, and a gate;
wherein said first floating body region is common to said second floating body region;
wherein said first buried layer region is common to said second buried layer region;
wherein said first substrate region is common to said second substrate region;
wherein a state of said semiconductor memory cell is maintained through a positive voltage applied to said first and second substrate regions;
wherein said transistor is usable to access said semiconductor memory cell;
wherein at least one of said first or second silicon controlled rectifier devices maintains a state of said semiconductor memory cell;

wherein said first and second buried layer regions are commonly connected to at least two of said semiconductor memory cells; and wherein said first and second substrate regions are commonly connected to said at least two of said semiconductor memory cells.

11. The semiconductor memory array of claim 10, wherein said first and second substrate regions are commonly connected to all of said semiconductor memory cells in said array.

12. The semiconductor memory array of claim 10, wherein said first and second substrate regions are segmented to allow independent control of bias applied on a selected portion of said semiconductor memory array.

13. The semiconductor memory array of claim 10, wherein said positive voltage applied to said first and second substrate regions is a constant positive voltage bias.

14. The semiconductor memory array of claim 10, wherein said positive voltage applied to said first and second substrate regions is a periodic pulse of positive voltage bias.

15. The semiconductor memory array of claim 10, wherein said state of said semiconductor memory cell is stored in said first and second floating body regions.

16. The semiconductor memory array of claim 10, wherein said first and second floating body regions and said first and second regions are formed in a fin that extends above said first and second buried layer regions, and said floating body regions are between said first and second regions.

17. An integrated circuit comprising:
a semiconductor memory array comprising a plurality of semiconductor memory cells arranged in a matrix of rows and columns, wherein each of said plurality of semiconductor memory cells comprises:
a first silicon controlled rectifier device having a first region, a first floating body region, a first buried layer region, and a first substrate region;
a second silicon controlled rectifier device having a second region, a second floating body region, a second buried layer region, and a second substrate region;
a transistor comprising said first region, said first floating body region, said second region, and a gate; and
a control circuit configured to provide electrical signals to said first and second substrate regions;
wherein said first floating body region is common to said second floating body region;
wherein said first buried layer region is common to said second buried layer region;
wherein said first substrate region is common to said second substrate region;
wherein at least one of said first or second silicon controlled rectifier devices maintains a state of said semiconductor memory cell;
wherein said transistor is usable to access said semiconductor memory cell;
wherein said state of said semiconductor memory cell is maintained and memory operations can be performed in an uninterrupted manner;
wherein said first and second buried layer regions are commonly connected to at least two of said semiconductor memory cells; and
wherein said first and second substrate regions are commonly connected to said at least two of said semiconductor memory cells.

18. The integrated circuit of claim 17, wherein said first and second substrate regions are commonly connected to all of said semiconductor memory cells in said array.

19. The integrated circuit of claim 17, wherein said first and second substrate regions are segmented to allow independent control of bias applied on a selected portion of said semiconductor memory array.

20. The integrated circuit of claim 17, wherein said state of said semiconductor memory cell is maintained through a positive voltage applied to said first and second substrate regions.

21. The integrated circuit of claim 20, wherein said positive voltage applied to said first and second substrate regions includes at least one of a constant positive voltage bias or a periodic pulse of positive voltage bias.

22. The integrated circuit of claim 17, wherein said first and second floating body regions and said first and second regions are formed in a fin that extends above said first and second buried layer regions, and said first and second floating body regions are between said first and second regions.

\* \* \* \* \*